United States Patent
Wang et al.

(10) Patent No.: US 10,811,115 B1
(45) Date of Patent: Oct. 20, 2020

(54) TEST METHOD FOR BUILT-IN MEMORY IN COMPUTER DEVICE

(71) Applicants: Inventec (Pudong) Technology Corporation, Shanghai (CN); INVENTEC CORPORATION, Taipei (TW)

(72) Inventors: Tzu-Pin Wang, Taipei (TW); Kuo-Hsin Hsu, Taipei (TW); I-Ting Liu, Taipei (TW); Che-Sheng Cheng, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/439,718

(22) Filed: Jun. 13, 2019

(30) Foreign Application Priority Data

May 27, 2019 (CN) .......................... 2019 1 0446881

(51) Int. Cl.
*G11C 29/38* (2006.01)
*G11C 29/44* (2006.01)
*G06F 9/4401* (2018.01)

(52) U.S. Cl.
CPC .......... *G11C 29/38* (2013.01); *G11C 29/4401* (2013.01); *G06F 9/4401* (2013.01)

(58) Field of Classification Search
CPC .... G11C 29/38; G11C 29/4401; G06F 9/4401
See application file for complete search history.

(56) References Cited

U.S. PATENT DOCUMENTS

| 5,758,056 A * | 5/1998 | Barr ........................ G11C 29/76 714/6.32 |
| 6,061,788 A * | 5/2000 | Reynaud ............... G06F 9/4406 713/100 |
| 2006/0047994 A1* | 3/2006 | Pu ............................ G06F 8/65 714/2 |
| 2012/0272095 A1* | 10/2012 | Liu ..................... G06F 11/1417 714/6.1 |
| 2016/0378990 A1* | 12/2016 | Goodman ............... G06F 21/64 726/19 |
| 2019/0188387 A1* | 6/2019 | Fu ............................ G06F 8/63 |

* cited by examiner

*Primary Examiner* — Kyle Vallecillo
(74) *Attorney, Agent, or Firm* — CKC & Partners Co., LLC

(57) ABSTRACT

A test method for testing a built-in memory in a computer device includes the following operations. The built-in memory is tested by a test function of a basic input/output system (BIOS) in the computer device to create a data file. An analysis application is performed by a test device to analyze the data file. According to analyzing the data file, an abnormal memory chip is determined whether to exist in the built-in memory. The data file includes test data of memory chips in the built-in memory.

7 Claims, 4 Drawing Sheets

Measure Eye Width, per BYTE, at ALL (2D) Timing Points- RankBitMask = 0x3 — 401

| Byte | Channel 0 | | | | | | | | Channel 1 | | | | | | | | 402 |
|---|---|---|---|---|---|---|---|---|---|---|---|---|---|---|---|---|---|
| | 0 | 1 | 2 | 3 | 4 | 5 | 6 | 7 | 0 | 1 | 2 | 3 | 4 | 5 | 6 | 7 | |
| Vref: -24 | | | | | | | | | | | | | | | | | |
| R0 L-R | 14-14 | 10-10 | 10-11 | 16-16 | 13-13 | 12-12 | 11-11 | 11-12 | 17-17 | 16-16 | 11-12 | 8-9 | 16-17 | 19-19 | 0-0 | 8-9 | |
| R1 L-R | 13-14 | 9-9 | 11-12 | 16-16 | 12-12 | 12-13 | 10-11 | 10-11 | 17-18 | 18-18 | 10-10 | 11-12 | 17-18 | 19-19 | 8-9 | 9-10 | |
| Vref: -18 | | | | | | | | | | | | | | | | | |
| R0 L-R | 15-15 | 11-11 | 12-12 | 16-17 | 13-14 | 13-13 | 11-12 | 12-12 | 17-18 | 17-18 | 12-12 | 10-10 | 17-17 | 19-20 | 0-0 | 11-11 | |
| R1 L-R | 14-15 | 10-10 | 12-13 | 17-17 | 13-13 | 13-14 | 11-12 | 11-11 | 18-19 | 19-19 | 11-11 | 12-13 | 18-19 | 20-20 | 9-10 | 10-11 | |
| Vref: -12 | | | | | | | | | | | | | | | | | |
| R0 L-R | 16-16 | 12-12 | 12-12 | 17-18 | 14-15 | 14-14 | 13-13 | 12-13 | 18-19 | 17-18 | 12-13 | 11-11 | 18-18 | 20-20 | 0-0 | 12-12 | |
| R1 L-R | 15-16 | 11-11 | 13-13 | 18-18 | 14-14 | 14-14 | 12-12 | 11-12 | 19-20 | 20-20 | 11-12 | 13-14 | 19-19 | 21-21 | 10-10 | 11-12 | |
| Vref: -6 | | | | | | | | | | | | | | | | | |
| R0 L-R | 16-17 | 12-12 | 13-13 | 18-19 | 16-16 | 15-16 | 14-14 | 13-14 | 19-20 | 19-19 | 14-14 | 12-12 | 18-19 | 21-21 | 0-1 | 11-11 | |
| R1 L-R | 16-17 | 11-12 | 14-14 | 19-19 | 15-15 | 14-15 | 13-14 | 12-13 | 20-20 | 21-21 | 13-13 | 14-15 | 20-20 | 21-22 | 11-11 | 12-13 | |
| Vref: 0 | | | | | | | | | | | | | | | | | |
| R0 L-R | 17-18 | 11-12 | 14-14 | 19-19 | 16-17 | 15-16 | 14-14 | 14-15 | 20-21 | 20-20 | 14-14 | 12-12 | 20-20 | 21-22 | 1-2 | 13-13 | |
| R1 L-R | 17-17 | 11-11 | 14-15 | 19-20 | 16-16 | 14-15 | 14-14 | 14-14 | 21-21 | 21-22 | 13-13 | 14-15 | 21-21 | 22-22 | 11-12 | 12-13 | |
| Vref: 6 | | | | | | | | | | | | | | | | | |
| R0 L-R | 17-18 | 10-11 | 14-15 | 19-20 | 16-17 | 15-16 | 14-15 | 14-15 | 20-21 | 20-21 | 13-13 | 11-12 | 20-20 | 22-22 | 2-3 | 11-11 | |
| R1 L-R | 17-17 | 10-11 | 15-16 | 20-20 | 16-17 | 13-13 | 14-15 | 14-15 | 21-21 | 21-22 | 12-13 | 13-14 | 20-21 | 22-22 | 11-12 | 13-13 | |
| Vref: 12 | | | | | | | | | | | | | | | | | |
| R0 L-R | 17-17 | 9-10 | 15-16 | 19-20 | 16-17 | 14-14 | 13-13 | 14-14 | 20-21 | 20-20 | 12-12 | 9-10 | 20-20 | 21-21 | 2-3 | 13-13 | |
| R1 L-R | 17-17 | 9-10 | 15-15 | 20-20 | 16-16 | 12-12 | 13-13 | 14-14 | 20-21 | 20-20 | 11-12 | 12-13 | 20-20 | 21-21 | 11-12 | 13-13 | |
| Vref: 18 | | | | | | | | | | | | | | | | | |
| R0 L-R | 15-16 | 8-9 | 14-14 | 18-19 | 15-16 | 13-13 | 12-12 | 13-14 | 20-20 | 19-20 | 11-12 | 9-10 | 18-19 | 20-20 | 3-3 | 12-12 | |
| R1 L-R | 16-16 | 9-9 | 15-15 | 19-19 | 16-16 | 11-12 | 13-13 | 12-13 | 20-20 | 20-20 | 11-11 | 12-12 | 19-20 | 20-21 | 10-10 | 11-12 | |
| Vref: 24 | | | | | | | | | | | | | | | | | |
| R0 L-R | 15-15 | 8-8 | 13-14 | 17-18 | 14-15 | 12-12 | 11-12 | 12-13 | 18-19 | 19-19 | 10-11 | 8-8 | 18-18 | 20-20 | 3-3 | 11-11 | |
| R1 L-R | 15-15 | 8-9 | 14-14 | 18-18 | 15-15 | 10-11 | 11-11 | 11-12 | 20-20 | 19-20 | 10-11 | 10-11 | 18-19 | 20-20 | 9-10 | 10-11 | |

| CHIP | CHANNEL | BYTE | | | |
|---|---|---|---|---|---|
| U4100 | 0 | 0 | 4 | 3 | 2 |
| U4101 | 0 | 1 | 7 | 6 | 5 |
| U4102 | 1 | 3 | 6 | 2 | 7 |
| U4103 | 1 | 1 | 4 | 0 | 5 |

TEST METHOD FOR BUILT-IN MEMORY IN COMPUTER DEVICE

PRIORITY CLAIM AND CROSS-REFERENCE

The present application claims priority to China application No. 201910446881.2, filed May 27, 2019, which is herein incorporated by reference.

BACKGROUND

The basic input/output system (BIOS) is configured as a communicated interface between the computer hardware and the operating system. Especially, when the computer is turning on, the BIOS is configured to correctly initialize the hardware in the computer, in order to make the hardware works properly after the operation system is operated.

When there is an abnormal hardware existing in the computer which results in failing to turning on the computer, the BIOS generates a warning sound to notice the user. The tester further uses a special BIOS to test the computer, in order to find the issue, in which a lot of labor cost is included in the process of switching hardware.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a schematic diagram of the data file, in accordance with some embodiments.

FIG. 4B is a schematic diagram of the location file, in accordance with some embodiments.

DETAILED DESCRIPTION

Figure 1:
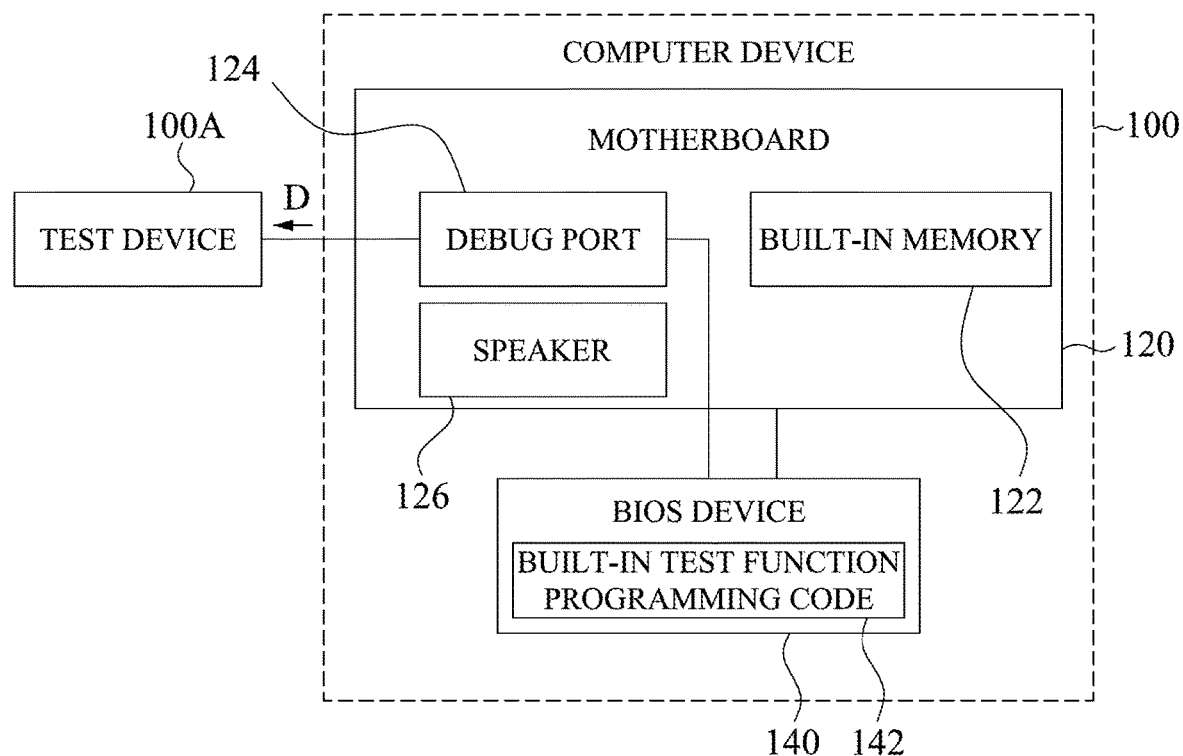
FIG. 1 is a schematic diagram of a computer system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference is made to FIG. 1. FIG. 1 is a schematic diagram of a computer system 10, according to some embodiments of the present disclosure. In some embodiments, the computer system 10 is configured to perform the test method illustrated in FIGS. 2 and 3, and the test method will be described below with respect to FIGS. 2 and 3.

For illustration in FIG. 1, the computer system 10 includes computer device 100 and a test device 100A. The test device 100A is coupled to the computer device 100. In some embodiments, the computer device 100 includes a motherboard 120 and a basic input/output system (BIOS) device 140. In some embodiments, the BIOS device 140 is disposed in the motherboard 120. In some embodiments, the motherboard 120 includes a built-in memory 122, a debug port 124, and a speaker 126.

In some embodiments, the test device 100A is coupled to the debug port 124 of the motherboard 120. In some embodiments, the BIOS device 140 is coupled to the debug port 124 of the motherboard 120.

In some embodiments, the computer device 100 is a personal computer (PC). In a normal condition, the computer device 100 is turned on by the BIOS device 140, in which the BIOS device 140 enables the motherboard 120. When there is an abnormal component existing in the motherboard (for example, an abnormal built-in memory 122), the computer device 100 fails on turning on. In some embodiments, when the motherboard 120 has a defect (for example, a broken capacitor), the defect results in that the computer device 100 fails on turning on. In some other embodiments, when the component is mounted improperly on the motherboard 120, the component is not able to work functionally and results in that the computer device 100 fails on turning on.

In some embodiments, when the computer device 100 fails on turning on, the test device 100A is coupled to the computer device and configured to turn on the computer device 100. Alternatively stated, when the computer device 100 is in the normal condition, it is not needed to be turned on by the test device 100A.

In some embodiments, the test device 100A tests the computer device 100 via the debug port 124. The test device 100A is a device which is able to execute programs, such as another computer device.

In some embodiments, the motherboard 120 further includes more sockets to install a central processing unit (CPU), a graphics card, hard disc drive, etc. (not shown). In some embodiments, the motherboard 120 is made by circuit, and the circuit is configured to connect the components on the motherboard 120.

In some embodiments, the built-in memory 122 is configured to store the programming codes for turning on the computer device 100. The built-in memory 122 is mounted directly on the motherboard 120 and hard to be switched manually. If the built-in memory 122 on the motherboard 120 is going to be switched, it costs a lot of time and labors to desolder the built-in memory 122 from the motherboard 120 and re-solder a new memory back to the motherboard 120. In some other embodiments, the built-in memory 122 includes double channels. Each channel includes memory chips. In some embodiments, the memory chip is dynamic random access memory (DRAM), for example, a double data rate synchronous dynamic random access memory (DDR SDRAM) chip. The arrangements of the built-in memory 122 above are provided for the illustrative purpose. Various arrangements of the built-in memory 122 are within the contemplated scope of the present disclosure. For example, the built-in memory 122 includes three or more channels.

In some embodiments, the debug port 124 is an input/output (I/O) port, which is configured to debug the potential issue occurred in the motherboard 120. The debug port 124 includes I/O pins. In some embodiments, the debug port 124 is a general purpose input output (GPIO) port, which includes GPIO pins configured to receive and/or output signals, for example, receiving a clock signal. In some embodiments, the user can use the present or customized programs to control the motherboard 120 by the GPIO pins.

In some embodiments, the BIOS device 140 is configured as a firmware interface. When the computer device 100 is turning on, the BIOS device 140 is configured to execute a power on self-test (POST). When the BIOD device 140 is executing the POST, the BIOS device 140 tests the components on the computer device 100 in order to check every components works properly. In some other embodiments, when there is an abnormal component existing on the computer device 100, the BIOS device 140 is configured to generate a warning signal, for example, generating a warning sound by the speaker 126. In other words, when the computer device 100 cannot be turned on normally, the BIOS device 140 generates warning signal to notice the user.

In some embodiments, the BIOS device 140 is further configured to load an operating system (OS) or an initial program loader (IPL) stored in the motherboard 120 when the computer device 100 is turned on successfully.

In some embodiments, the BIOS device 140 includes a test function programming code 142. The built-in test function programming code 142 is configured to store a test function. In some embodiments, the test device 100A is configured to enable the test function in the test function programming code 142, and use the test function to test whether an abnormal memory chip exists in the built-in memory 122. When the test function is performed, a data file D associated with the information of the built-in memory 122 is created. When performing the test function is done, the test device 100A captures the data file D through the debug port 124. The data file D includes test data of each memory chips in the built-in memory 122. In some embodiments, the format of the data file D is plain-text, for example, a .txt file.

Figure 2:
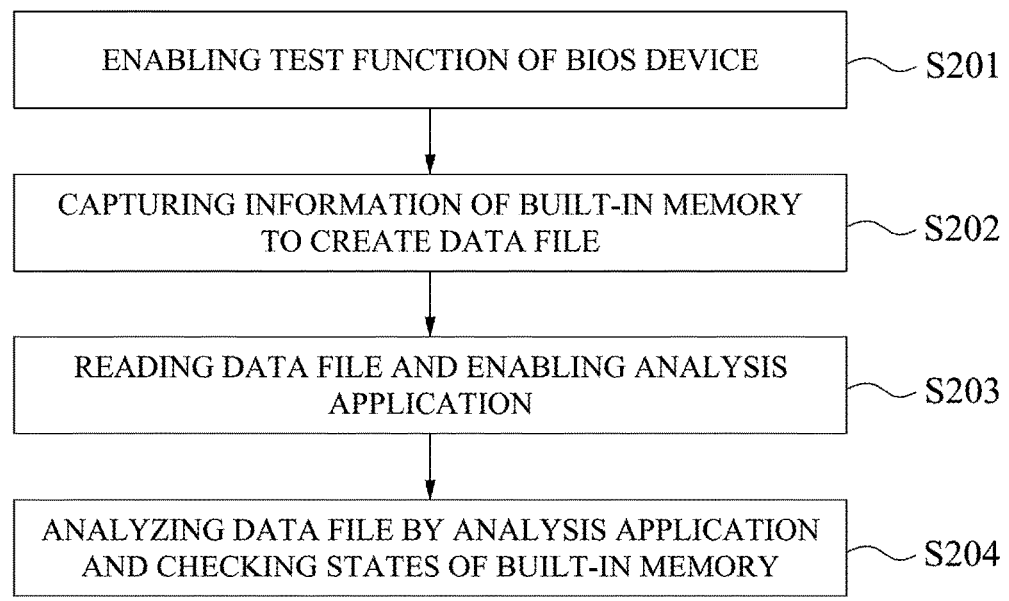
FIG. 2 is a flow chart of a test method for the computer system in FIG. 1, in accordance with some embodiments.

Reference is made to FIG. 2. FIG. 2 is a flow chart of a test method 200 for the computer system 10 in FIG. 1, according to some embodiments of the present disclosure. For ease of understanding, the test method 200 will be described with the same reference numbers as FIG. 1. For illustration in FIG. 2, the test method 200 includes operations S201, S202, S203, and S204. Because the built-in memory 122 is hard to be switched manually, the test method 200 is performed without switching the built-in memory 122.

In operation S201, the test function in the BIOS device 140 is enabled by the test device 100A. The test device 100A, through the debug port 124, makes the test function being performed.

In operation S202, the test function is performed to test the built-in memory 122 on the motherboard 120, and the test data of the built-in memory 122 is captured. The data file D is created according to the test data of the built-in memory 122.

In some embodiments, when the test function is performed to test the built-in memory 122, each memory chip in the built-in memory 122 is tested. In some embodiments, responded voltages of each memory chip are recorded as a part of data file D. In some embodiments, the responded voltages of the memory chips are voltage drop crossing the memory chip itself under a normal operating voltage. For example, the responded voltage is a voltage drop crossing the memory chip in a write operation. For another example, the responded voltage is a voltage drop crossing the memory chip in a read operation.

In some embodiments, each memory chip is tested several times under different conditions. For example, the test function is performed to test each memory chip under nine conditions which are different to each other, therefore, each memory chip has nine test data.

In operation S203, the test device 100A reads the data file D through the debug port 124, and start an analysis application stored in the test device 100A.

In some embodiments, the analysis application is stored in the BIOS device 140, and the test device 100A is configured to enable the analysis application to perform the function of the analysis application. The device and location to store the analysis application above are provided for illustrative purposes. Various devices and locations for storing the analysis application are within the contemplated scope of the present disclosure.

In operation S204, by the analysis application, the data file D is analyzed to check the state of each memory chip in the built-in memory 122.

The test method 200 in FIG. 2 is provided for illustrative purposes, but the present disclosure is not limited herein. Various test method 200 are within the contemplated scope of the present disclosure.

Figure 3:
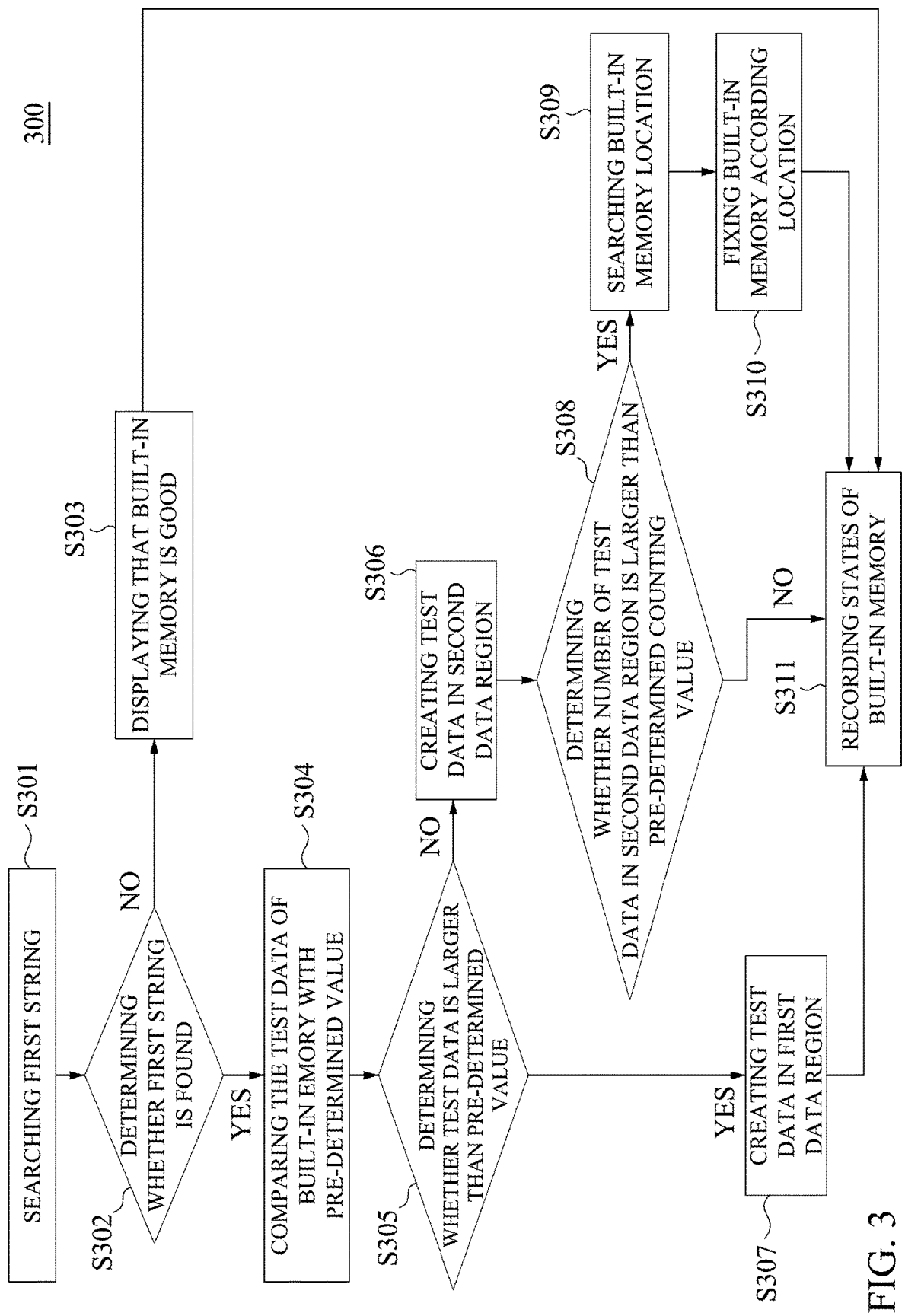
FIG. 3 is a detailed flow chart of part of the test method in FIG. 2, in accordance with some embodiments.

Reference is made to FIG. 3. FIG. 3 is a flow chart of test method 300, which is a detailed flow chart of part of the test method 200 in FIG. 2, according to some embodiments of the present disclosure. For illustration in FIG. 3, the test method 300 includes operations S301, S302, S303, S304, S305, S306, S307, S308, S309, S310, and S311. In some embodiments, the test method 300 is a detailed flow chart of the operation S204. For better understanding, the test method 300 will be described with respect to FIG. 1 and FIG. 2, but the present disclosure is not limited herein.

In operation S301, the test device 100A performs the analysis application to search a first string in strings of the data file D. In some embodiments, when the strings of the data file D include the first string, the data file D indicates that there is an abnormal memory chip existing in the built-in memory 122.

In operation S302, the operation S302 is performed to determine whether the first string is found in the data file D. When the first string is not found, the operation S303 is then performed. In contrast, when the first string is found, the operation S304 is performed.

In operation S303, the first string is not found after performing the analysis application, and the test device 100A displays, by a displaying device (not shown), that there is no abnormal memory chip existing in the built-in memory 122. In some embodiments, the test device 100A is configured to display the test result by itself.

In operation S304, according to the found first string, the operation S304 is performed to search the information listed below the first string. The information listed below the first string is the test data of the memory chips. After the test data of the memory chips is found, the test data is compared to a predetermined value. In some embodiments, the predetermined value is the electricity margins of the memory chips, which is configured to indicate margins the physical characteristic (for example, the responded voltage) of a device under test during being operated or tested.

In operation S305, the operation S305 is performed to determine whether the test data of each memory chip is larger than the predetermined value. For illustration in FIG. 3, when the test data of the memory chips is not larger than the predetermined value, the operation S306 is performed. When the test data of the memory chips is larger than the predetermined value, the operation S307 is performed.

In operation S307, when the test data of the memory chips is larger than the predetermined value, the memory chips are categorized to normal memory chip, and the test data of the said memory chips are created in a first data zone of the analysis application.

In operation S306, when the test data of the memory chips is not larger than the predetermined value, the memory chips are categorized to potentially abnormal memory chip, and the test data of the said memory chips are creates in a second data zone of the analysis application.

In some embodiments, after each memory chip is tested under several test conditions in operation S204, the test data including information corresponding to the test conditions is obtained. In operation S308, a number of the test data of the potentially abnormal memory chip not larger than the predetermined value is calculated, and the number is determined whether it is more than a predetermined counting value. For example, in operation S305, one memory chip has nine sets of information in the test data, and there is at least one set of information not larger than the predetermined value, therefore, this memory chip is categorized to potentially abnormal memory chip. Later, in operation S308, this memory chip has five sets of information in the test data which are note larger than the predetermined value, thus, the number of test data of this memory chip not larger than the predetermined value is recorded as five, and the number is determined whether it is larger than the predetermined counting value. When the recorded number of the memory chip is larger than the predetermined counting value, the memory chip is determined as an abnormal memory chip. When the recorded number of the memory chip is not larger than the predetermined counting value, the memory chip is determined as a normal memory chip. Alternatively stated, when a memory chip is determined as an abnormal memory chip, this memory chip must have a number of abnormal information in the test data more than the predetermined counting value.

For illustration in FIG. 3, when the recorded number of the memory chip is larger than the predetermined counting value, the operation S309 is performed. When all of the potentially abnormal memory chips have no number larger than the predetermined counting value, the operation S311 is performed.

In operation S309, according to a location file of the built-in memory 122, physical locations of the abnormal memory chips in the built-in memory 122 are searched.

In operation S310, according to the searched physical locations, those memory chips are fixed. After the physical locations of the abnormal memory chips are founded, the abnormal memory chips are desoldered and moved away from the built-in memory 122. In some embodiments, the new memory chips are soldered into the built-in memory 122, in order to maintain the number of memory chips in the built-in memory 122.

In some approaches, when the tester tests the memory of the computer, the tester switches the BIOS of the computer with debug BIOS which is especially configured for testing the computer, and then tests the computer according to the function of the debug BIOS. After testing the computer, the tester switches the original BIOS back to the computer. The tester has to spend time to switch the hardware for testing the computer.

Compared to the above approaches, according to the present disclosure, the computer device 100 is able to be test by performing the test function of the BIOS device 140, and then the abnormal memory chip is able to be found directly according to the analysis application of the test device 100A. The debugging range is narrowed down from the whole built-in memory 122 to a single memory chip of the channels of the built-in memory 122. Therefore, the labor cost of switching hardware is decreased, and the test efficiency is increased. For example, the labor cost is decreased by omitted the process of desoldering and re-soldering the built-in memory 122 and the BIOS device 140.

In operation S311, the states of the built-in memory 122 are recorded. After the operation S303, because the built-in memory 122 is normal, the built-in memory 122 is recorded as good. After the operation S307, those memory chips categorized as normal are recorded as good. After the operation S308, because those memory chips have the number not larger than the predetermined counting value, those memory chips are recorded as good. After the operation S310, because the abnormal memory chips are fixed, the memory chips are recorded as fixed.

The above illustrations include exemplary operations, but the operations of test method 30 are not necessarily performed in the order shown. Operations of test method 300 may be added, replaced, changed order, and/or eliminated as appropriate, in accordance with the spirit and scope of various embodiments of the present disclosure. For example, after the operation S309, the computer device 100 generates different warning sound and/or indicating light according to the locations of the abnormal memory chips, in order to indicate the user where the locations of the abnormal memory chips are. For another example, the operation S311 is omitted.

Reference is made to FIGS. 4A and 4B. FIG. 4A is a schematic diagram of the data file 400A, according to some embodiments of the present disclosure. FIG. 4B is a schematic diagram of the location file 400B, according to some embodiments of the present disclosure. For ease of understanding, FIGS. 4A and 4B will be described with respect to the embodiments of FIGS. 1-3, but the present disclosure is not limited hereto.

In some embodiments, the data file 400A is a part of data file D. The data file 400A is a part of data file D including the first string and the test data of the built-in memory 122. For illustration in FIG. 4A, the dash line box 401 indicates the first string in the data file 400A. As shown in FIG. 4A, the first string is "Measure Eye Width, per BYTE, at ALL (2D) Timing Points-RandBitMask=0x3". In operation S301, when the first string is found by the analysis application, the information listed below the first string is the test data of the built-in memory 122.

For illustration in FIG. 4A, the dash line box 402 indicates the test data which is not larger than the predetermined value. As shown in FIG. 4A, the predetermined value is "5-5", and the test data in the dash line box 402 has values which are not larger than "5-5". In operations S304 and S305, the data file 400A indicates that the memory chip Byte6 in the channel 1 of the built-in memory 122 is a potentially abnormal memory chip. Other memory chips are categorized as normal because those memory chips do not have values not larger than the predetermined value.

Reference is made to FIG. 4A again. The test data in the dash line box 402 includes nine sets of test data which are not larger than the predetermined value. In operation S308, the test data of the memory chip Byte6 in the channel 1 has nine sets of test data, therefore, the number is recorded as nine. Then, the number is compared to the predetermined counting value. As shown in FIG. 4A, the predetermined counting value is six. The number of the memory chip Byte6 in the channel 1 is larger than six, thus, the memory chip Byte6 in the channel 1 is recorded as abnormal.

Reference is made to FIG. 4B. The location file 400B includes the information of locations and channels of the memory chips. The dash line boxes 403 and 404 indicate the location information of the abnormal memory chip Byte6 obtained from the data file 400A, in which the location information in the location file 400B corresponds to the physical location in the built-in memory 122. As shown in FIG. 4B, the location information of the memory chip Byte6 is "CHIP U4102". In operation S310, the memory chip of built-in memory 122 is fixed according to "CHIP U4102" obtained from the location file 400B.

The data file 400A and the location file 400B in FIGS. 4A-4B are provided for illustrative purposes. Various data files 400A and location files 400B are within the contemplated scope of the present disclosure.

A test method for testing a built-in memory in a computer device includes the following operations. The built-in memory is tested by a test function of a basic input/output system (BIOS) in the computer device to create a data file. An analysis application is performed by a test device to analyze the data file. According to analyzing the data file, an abnormal memory chip is determined whether to exist in the built-in memory. The data file includes test data of memory chips in the built-in memory.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A test method for testing a built-in memory in a computer device, comprising:
   by a test function of a basic input/output system (BIOS) in the computer device, testing the built-in memory to create a data file;
   by a test device, performing an analysis application to analyze the data file; and
   according to analyzing the data file, determining whether an abnormal memory chip exists in the built-in memory,
   wherein the data file comprises a plurality of test data of a plurality of memory chips in the built-in memory;
   according to a location file of the built-in memory, searching locations of the abnormal memory chips in the plurality of memory chips; and
   according to the locations of the abnormal memory chips, desoldering the abnormal memory chips.

2. The test method of claim 1, further comprising:
   when there is the abnormal memory chip existing in the built-in memory, fixing the abnormal memory chip.

3. The test method of claim 1, wherein testing the built-in memory to create the data file comprises:
   performing a plurality of tests on the plurality of memory chips in the built-in memory, respectively, to generate the plurality of test data.

4. The test method of claim 3, wherein performing the plurality of tests is configured to test responded voltages of the plurality of memory chips, and record the responded voltages of the plurality of memory chips as the plurality of test data.

5. The test method of claim 1, wherein performing the analysis application to analyze the data file by the test device comprises:
   searching a first string in the data file;
   according to the first string, comparing the plurality of test data to a predetermined value; and
   after comparing the plurality of test data to the predetermined value, counting numbers of the plurality of test data that are smaller than the predetermined value, of the plurality of memory chips, respectively.

6. The test method of claim 5, wherein determining whether an abnormal memory chip existing in the built-in memory comprises:
   comparing the numbers of the plurality of test data of the plurality of memory chips smaller than the predetermined value to a predetermined counting value; and
   determining the plurality of memory chips having the numbers larger than the predetermined counting value as abnormal.

7. The test method of claim 1, further comprising:
   when there is no abnormal memory chip existing in the built-in memory, displaying, by the test device, the built-in memory of the computer device is good.

* * * * *